(12) United States Patent
Walker et al.

(10) Patent No.: US 11,488,643 B2
(45) Date of Patent: Nov. 1, 2022

(54) METHOD FOR CONFIGURING MULTIPLE INPUT-OUTPUT CHANNELS

(71) Applicant: Micron Technology, Inc., Boise, ID (US)

(72) Inventors: Dean E. Walker, Allen, TX (US); Tony Brewer, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 23 days.

(21) Appl. No.: 17/007,876

(22) Filed: Aug. 31, 2020

(65) Prior Publication Data
US 2022/0068324 A1    Mar. 3, 2022

(51) Int. Cl.
*G11C 7/10* (2006.01)
*G06F 9/30* (2018.01)
*G06F 13/16* (2006.01)
*H01L 23/538* (2006.01)

(52) U.S. Cl.
CPC ........ *G11C 7/1006* (2013.01); *G06F 9/30101* (2013.01); *G06F 13/1694* (2013.01); *G11C 7/1069* (2013.01); *G11C 7/1096* (2013.01); *H01L 23/5382* (2013.01)

(58) Field of Classification Search
CPC ............. G06F 9/30101; G06F 13/1694; G11C 7/1096; G11C 7/1006; H01L 23/5382
See application file for complete search history.

(56) References Cited

U.S. PATENT DOCUMENTS

| 10,528,513 B1* | 1/2020 | Chan ........................ G06F 1/10 |
| 2008/0270708 A1 | 10/2008 | Warner et al. |
| 2014/0048947 A1* | 2/2014 | Lee ........................ H01L 25/18 257/777 |
| 2016/0358671 A1 | 12/2016 | Lee et al. |
| 2019/0324928 A1 | 10/2019 | Brewer |
| 2020/0051961 A1 | 2/2020 | Rickard et al. |
| 2020/0105718 A1 | 4/2020 | Collins et al. |
| 2020/0211966 A1 | 7/2020 | Raorane |

FOREIGN PATENT DOCUMENTS

KR    20190053275 A    5/2019

OTHER PUBLICATIONS

"International Application Serial No. PCT/US2021/039786, International Search Report dated Oct. 22, 2021", 4 pgs.
"International Application Serial No. PCT/US2021/039786, Written Opinion dated Oct. 22, 2021", 5 pgs.

* cited by examiner

*Primary Examiner* — Tri M Hoang
(74) *Attorney, Agent, or Firm* — Schwegman Lundberg & Woessner, P.A.

(57) ABSTRACT

A system comprises an interposer including multiple conductive interconnects; multiple chiplets arranged on the interposer and interconnected by the interposer; each chiplet including a die-to-die physical layer interface including one or more pads to engage the interconnect of the interposer; and wherein at least one chiplet includes multiple input-output channels organized into at least one column and arranged in an order at a periphery of the chiplet forming a die-to-die physical layer interface to engage the interconnects of the interposer, wherein the order of the channels of the column is programmable.

11 Claims, 7 Drawing Sheets

METHOD FOR CONFIGURING MULTIPLE INPUT-OUTPUT CHANNELS

GOVERNMENT RIGHTS

This invention was made with U.S. Government support under Agreement No. HR0011180003, awarded by Defense Advanced Research Projects Agency (DARPA). The U.S. Government has certain rights in the invention.

TECHNICAL FIELD

Embodiments of the disclosure relate generally to chiplet-based systems, and more specifically to methods to initialize or configure such chiplets and other components in such systems.

BACKGROUND

Chiplets are an emerging technique for integrating various processing functionality. Generally, a chiplet system is made up of discrete chips (e.g., integrated circuits (ICs) on different substrate or die) that are integrated on an interposer and packaged together. This arrangement is distinct from single chips (e.g., ICs) that contain distinct device blocks (e.g., intellectual property (IP) blocks) on one substrate (e.g., single die), such as a system-on-a-chip (SoC), or discretely packaged devices integrated on a board. In general, chiplets provide better performance (e.g., lower power consumption, reduced latency, etc.) than discretely packaged devices, and chiplets provide greater production benefits than single die chips. These production benefits can include higher yields or reduced development costs and time.

Chiplet systems are generally made up of one or more application chiplets and support chiplets. Here, the distinction between application and support chiplets is simply a reference to the likely design scenarios for the chiplet system. Thus, for example, a synthetic vision chiplet system can include an application chiplet to produce the synthetic vision output along with support chiplets, such as a memory controller chiplet, sensor interface chiplet, or communication chiplet. In a typical use case, the synthetic vision designer can design the application chiplet and source the support chiplets from other parties. Thus, the design expenditure (e.g., in terms of time or complexity) is reduced because by avoiding the design and production of functionality embodied in the support chiplets. Chiplets also support the tight integration of IP blocks that can otherwise be difficult, such as those using different feature sizes. Thus, for example, devices designed during a previous fabrication generation with larger feature sizes, or those devices in which the feature size is optimized for the power, speed, or heat generation (e.g., for sensor applications) can be integrated with devices having different feature sizes more easily than attempting to do so on a single die. Additionally, by reducing the overall size of the die, the yield for chiplets tends to be higher than that of more complex, single die devices.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, various embodiments discussed in the present document.

DETAILED DESCRIPTION

Embodiments of the present disclosure are directed to initializing electronic systems that include chiplets. The system may include chiplets that each perform a different function, or the chiplets may perform the same function, but configuring multiple chiplets together (e.g., to implement parallelism of the function) results in a higher performance solution. The chiplets may be arranged in a tightly packed matrix to create a higher performance functional block in a minimum footprint. Within the context of a chiplet system an issue can arise in aligning input-output (I/O) of the chiplets.

Figure 1A:
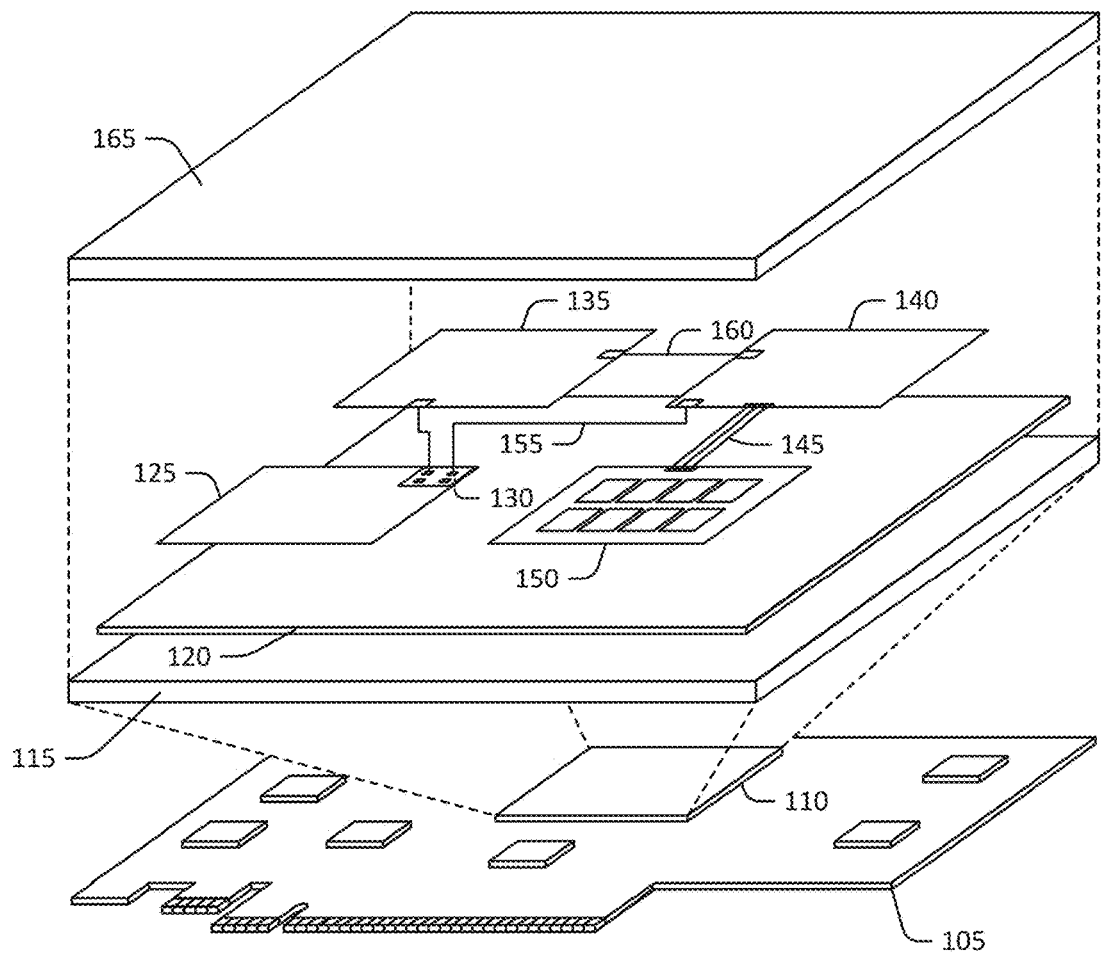
FIGS. 1A-1B illustrate an example of a chiplet system, in accordance with some examples described herein.
Figure 1B:
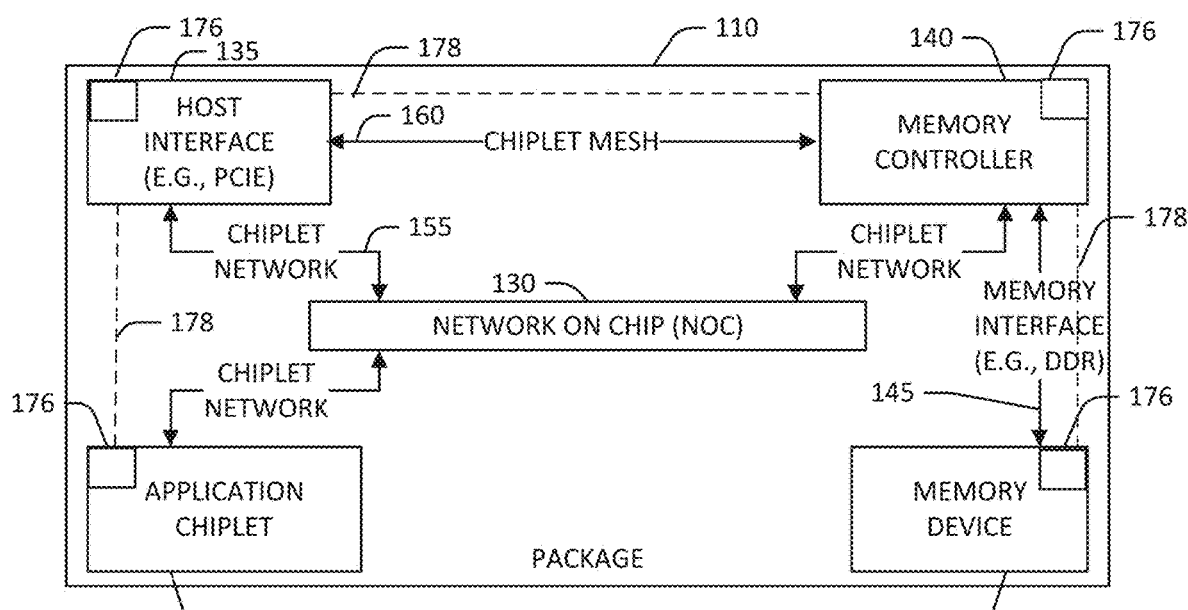

FIGS. 1A and 1B illustrate an example of a chiplet system 110. FIG. 1A is a representation of the chiplet system 110 mounted on a peripheral board 105, that can be connected to a broader computer system by a peripheral component interconnect express (PCIe), for example. The chiplet system 110 includes a package substrate 115, an interposer 120, and four chiplets; an application chiplet 125, a host interface chiplet 135, a memory controller chiplet 140, and a memory device chiplet 150. The interposer 120 includes conductive interconnect connected to the chiplets. The package of the chiplet system 110 is illustrated with a lid 165, though other covering techniques for the package can be used. FIG. 1B is a block diagram labeling the components in the chiplet system for clarity.

The application chiplet 125 is illustrated as including a network-on-chip (NOC) 130 to support an inter-chiplet communications network, or chiplet network 155. The NOC 130 is generally included on the application chiplet 125 because it is usually created after the support chiplets (e.g., chiplets 135, 140, and 150) are selected, thus enabling a designer to select an appropriate number of chiplet network connections or switches for the NOC 130. In an example, the NOC 130 can be located on a separate chiplet, or even within the interposer 120. In an example, the NOC 130 implements a chiplet protocol interface (CPI) network.

A CPI network is a packet-based network that supports virtual channels to enable a flexible and high-speed interaction between chiplets. CPI enables bridging from intra-chiplet networks to the chiplet network 155. For example, the Advanced eXtensible Interface (AXI) is a widely used specification to design intra-chip communications. AXI specifications, however, cover a great variety of physical design options, such as the number of physical channels, signal timing, power, etc. Within a single chip, these options are generally selected to meet design goals, such as power consumption, speed, etc. To achieve the flexibility of the chiplet system, CPI is used as an adapter to interface between the various AXI design options that can be used across the various chiplets. By enabling a physical channel to virtual channel mapping and encapsulating time-based signaling with a packetized protocol, CPI successfully bridges intra-chiplet networks across the chiplet network 155.

CPI can use a variety of different physical layers to transmit packets. The physical layer can include simple conductive connections or include drivers to transmit the signals over longer distances or drive greater loads. An example of one such physical layer can include the Advanced Interface Bus (AIB), implemented in the interposer 120. AIB transmits and receives data using source synchronous data transfers with a forwarded clock. Packets are transferred across the AIB at single data rate (SDR) or dual data rate (DDR) with respect to the transmitted clock. Various channel widths are supported by AIB. AIB channel widths are in multiples of 20 bits when operated in SDR mode (20, 40, 60, . . . ), and 40 bits for DDR mode: (40, 80, 120, . . . ). The AIB channel width includes both transmit and receive signals. The channel can be configured to have a symmetrical number of transmit (TX) and receive (RX) input/outputs (I/Os), or have a non-symmetrical number of transmitters and receivers (e.g., either all transmitters or all receivers). The AIB channel can act as an AIB principal channel or secondary/subordinate channel depending on which chiplet provides the data transfer clock. AIB I/O cells support three clocking modes: asynchronous (i.e. non-clocked), SDR, and DDR. The non-clocked mode is used for clocks and some control signals. The SDR mode can use dedicated SDR only I/O cells, or dual use SDR/DDR I/O cells.

In an example, CPI packet protocols (e.g., point-to-point or routable) can use symmetrical receive and transmit I/O cells within an AIB channel. The CPI streaming protocol allows more flexible use of the AIB I/O cells. In an example, an AIB channel for streaming mode can configure the I/O cells as all TX, all RX, or half RX and half RX. CPI packet protocols can use an AIB channel in either SDR or DDR operation modes. In an example, the AIB channel is configurable in increments of 80 I/O cells (i.e. 40 TX and 40 RX) for SDR mode and 40 I/O cells for DDR mode. The CPI streaming protocol can use an AIB channel in either SDR or DDR operation modes. Here, in an example, the AIB channel is in increments of 40 I/O cells for both SDR and DDR modes. In an example, each AIB channel is assigned a unique interface identifier. The interface identifier is used during CPI reset and initialization to determine paired AIB channels across adjacent chiplets. In an example, the interface identifier is a 20-bit value comprising a seven-bit chiplet identifier, a seven-bit column identifier, and a six-bit link identifier. The AIB physical layer transmits the interface identifier using an AIB out-of-band shift register. The 20-bit interface identifier is transferred in both directions across an AIB interface using bits 32-51 of the shift registers.

AIB defines a stacked set of AIB channels as an AIB channel column. An AIB channel column has some number of AIB channels, plus an auxiliary (AUX) channel that can be used for out-of-band signaling. The auxiliary channel contains signals used for AIB initialization. All AIB channels (other than the auxiliary channel) within a column are of the same configuration (e.g., all TX, all RX, or half TX and half RX, as well as having the same number of data I/O signals). In an example, AIB channels are numbered in continuous increasing order starting with the AIB channel adjacent to the AUX channel. The AIB channel adjacent to the AUX is defined to be AIB channel zero.

In general, CPI interfaces of individual chiplets can include serialization-deserialization (SERDES) hardware. SERDES interconnects work well for scenarios in which high-speed signaling with low signal count are desirable. However, SERDES can result in additional power consumption and longer latencies for multiplexing and demultiplexing, error detection or correction (e.g., using block level cyclic redundancy checking (CRC)), link-level retry, or forward error correction. For ultra-short reach chiplet-to-chiplet interconnects where low latency or energy consumption is a primary concern, a parallel interface with clock rates that allow data transfer with minimal latency can be a better solution. CPI includes elements to minimize both latency and energy consumption in these ultra-short reach chiplet interconnects.

For flow control, CPI employs a credit-based technique. A CPI recipient, such as the application chiplet 125, provides a CPI sender, such as the memory controller chiplet 140, with credits that represent available buffers. In an example, a CPI recipient includes a buffer for each virtual channel for a given time-unit of transmission. Thus, if the CPI recipient supports five messages in time and a single virtual channel, the recipient has five buffers arranged in five rows (e.g., one row for each unit time). If four virtual channels are supported, then the CPI recipient has twenty buffers arranged in five rows. Each buffer is sized to hold the payload of one CPI packet.

When the CPI sender transmits to the CPI recipient, the sender decrements the available credits based on the transmission. Once all credits for the recipient are consumed, the sender stops sending packets to the recipient. This ensures that the recipient always has an available buffer to store the transmission.

As the recipient processes received packets and frees buffers, the recipient communicates the available buffer space back to the sender. This credit return can then be used by the sender to transmit additional information.

Also illustrated in FIGS. 1A and 1B is a chiplet mesh network 160 that uses a direct, chiplet-to-chiplet technique without the need for the NOC 130. The chiplet mesh network 160 can be implemented in CPI, or another chiplet-to-chiplet protocol. The chiplet mesh network 160 generally enables a pipeline of chiplets where one chiplet serves as the interface to the pipeline while other chiplets in the pipeline interface only with themselves.

Additionally, dedicated device interfaces can be used to interconnect chiplets. Some examples of a dedicate device interface include memory interface 145, and a serial peripheral interface (SPI) that includes an SPI bus 178 and SPI controllers 176. Dedicated device interfaces can also be used to connect chiplets to external devices; such as the host interface chiplet 135 providing a PCIE interface external to the board 105 for the application chiplet 125. Such dedicated interfaces 145 are generally used when a convention or standard in the industry has converged on such an interface.

The illustrated example of a Double Data Rate (DDR) interface 145 connecting the memory controller chiplet 140 to a dynamic random access memory (DRAM) memory device chiplet 150 is an example of such an industry convention.

Of the variety of possible support chiplets, the memory controller chiplet 140 is likely present in the chiplet system 110 due to the near omnipresent use of storage for computer processing as well as a sophisticated state-of-the-art for memories. Thus, using memory device chiplets 150 and memory controller chiplets 140 produced by others gives chiplet system designers access to robust products by sophisticated producers. Generally, the memory controller chiplet 140 provides a memory device specific interface to read, write, or erase data. Often, the memory controller chiplet 140 can provide additional features, such as error detection, error correction, maintenance operations, or atomic operation execution. Maintenance operations tend to be specific to the memory device chiplet 150, such as garbage collection in NAND flash or storage class memories, temperature adjustments (e.g., cross temperature management) in NAND flash memories. In an example, the maintenance operations can include logical-to-physical (L2P) mapping or management to provide a level of indirection between the physical and logical representation of data.

Atomic operations are a data manipulation performed by the memory controller chiplet 140. For example, an atomic operation of "increment" can be specified in a command by the application chiplet 125, the command including a memory address and possibly an increment value. Upon receiving the command, the memory controller chiplet 140 retrieves a number from the specified memory address, increments the number by the amount specified in the command, and stores the result. Upon a successful completion, the memory controller chiplet 140 provides an indication of the command's success to the application chiplet 125. Atomic operations avoid transmitting the data across the chiplet network 160, resulting in lower latency execution of such commands.

Atomic operations can be classified as built-in atomics or programmable (e.g., custom) atomics. Built-in atomics are a finite set of operations that are immutably implemented in hardware. Programmable atomics are small programs that can run on a programmable atomic unit (PAU) (e.g., a custom atomic unit (CAU)) of the memory controller chiplet 140. An example of a memory controller chiplet 140 implementing a PAU is described in regard to FIG. 2.

The memory device chiplet 150 can be, or can include, any combination of volatile memory devices or non-volatile memories. Examples of volatile memory devices include, but are not limited to, random access memory (RAM), dynamic RAM (DRAM), synchronous DRAM (SDRAM), and graphics double data rate type 6 SDRAM (GDDR6 SDRAM). Examples of non-volatile memory devices include, but are not limited to, negative-and-(NAND)-type flash memory, storage class memory (e.g., phase-change memory or memristor based technologies), and ferroelectric RAM (FeRAM). The illustrated example of FIGS. 1A and 1B includes the memory device 150 as a chiplet, however, the memory device 150 can reside elsewhere, such as in a different package on the board 105.

Figure 2:
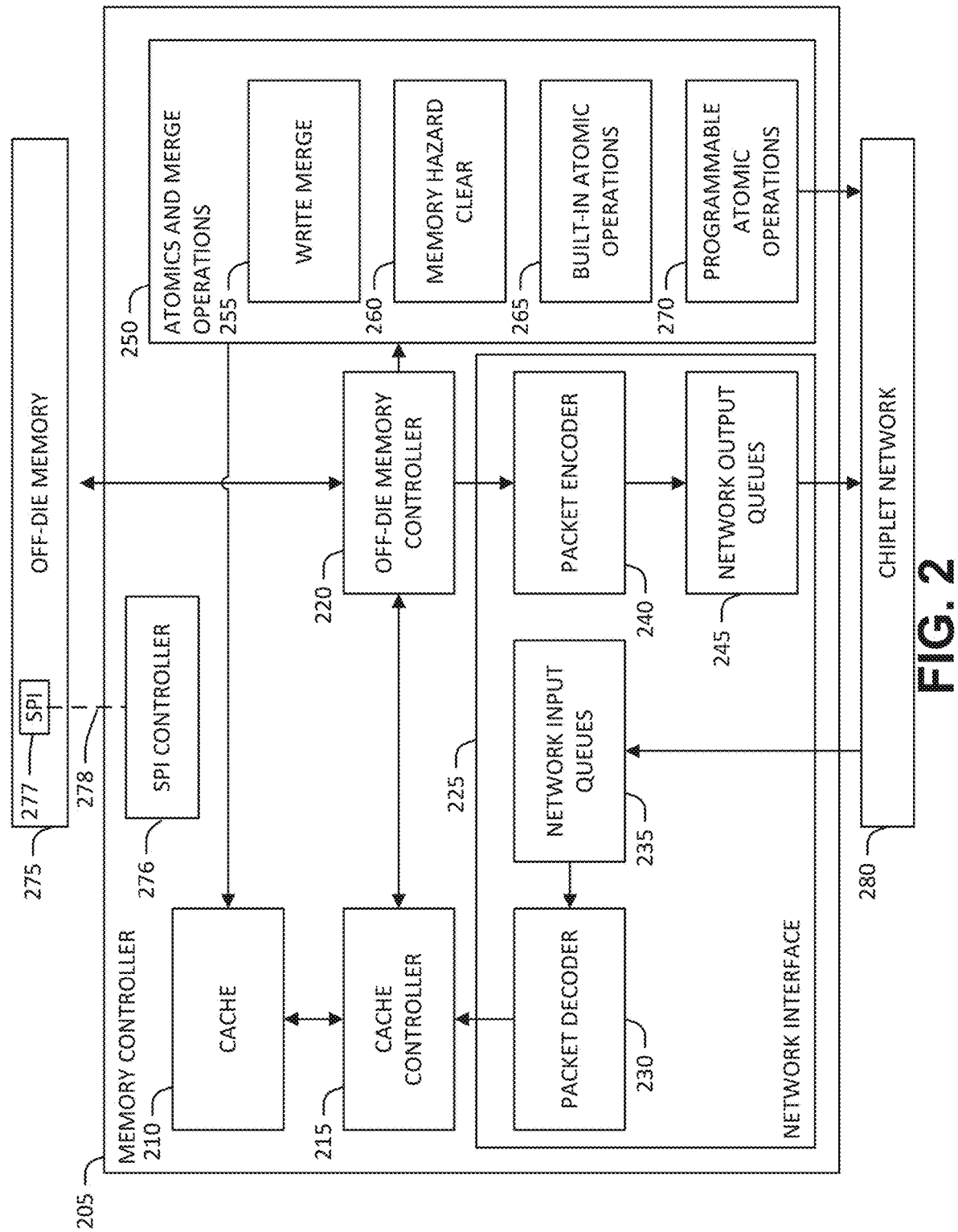
FIG. 2 is a block diagram of an example of a memory controller chiplet, in accordance with some examples described herein.

FIG. 2 illustrates components of an example of a memory controller chiplet 205, according to an embodiment. The memory controller chiplet 205 includes a cache 210, a cache controller 215, an off-die memory controller 220 (e.g., to communicate with off-die memory 275), a network communication interface 225 (e.g., to interface with a chiplet network 280 and communicate with other chiplets), and a set of atomic and merge operations 250. Members of this set can include a write merge unit 255, a hazard unit (260), built-in atomic unit 265, or a PAU 270. The various components are illustrated logically, and not as they necessarily would be implemented. For example, the built-in atomic unit 265 likely comprises different devices along a path to the off-die memory. In contrast, the programmable atomic operations 270 are likely implemented in a separate processor on the memory controller chiplet 205.

The off-die memory controller 220 is directly coupled to the off-die memory 275 (e.g., via a bus or other communication connection) to provide write operations and read operations to and from the off-die memory 275. The off-die memory controller 220 is also coupled for output to the atomic and merge operations unit 250, and for input to the cache controller 215 (e.g., a memory side cache controller). The memory controller chiplet 205 may also include a serial peripheral interface (SPI) controller 276 coupled to an SPI 277 of the memory device by SPI bus 278.

The cache controller 215 is directly coupled to the cache 210, and also coupled to the network communication interface 225 for input (such as incoming read or write requests) and to the off-die memory controller 220 for output.

The network communication interface 225 includes a packet decoder 230, network input queues 235, a packet encoder 240, and network output queues 245 to support a packet-based chiplet network 280 (e.g., a CPI network). The chiplet network 280 can provide packet routing between and among processors, memory controllers, hybrid threading processors, configurable processing circuits, or communication interfaces. In such a packet-based communication system, each packet typically includes destination and source addressing, along with any data payload or instruction. In an example, the chiplet network 280 can be implemented as a collection of crossbar switches having a folded clos configuration, or a mesh network providing for additional connections, depending upon the configuration. The chiplet network 280 can be part of an asynchronous switching fabric. In this example, a data packet can be routed along any of various paths, such that the arrival of any selected data packet at an addressed destination can occur at any of a plurality of different times, depending upon the routing. The chiplet network 280 can be implemented as a synchronous communication network, such as a synchronous mesh communication network. Any and all such communication networks are considered equivalent and within the scope of the disclosure.

The memory controller chiplet 205 can receive a packet having a source address, a read request, and a physical address. In response, the off-die memory controller 220 or the cache controller 215 will read the data from the specified physical address (which can be in the off-die memory 275 or in the cache 210) and assemble a response packet to the source address containing the requested data. Similarly, the memory controller chiplet 205 can receive a packet having a source address, a write request, and a physical address. In response, the memory controller chiplet 205 will write the data to the specified physical address (which can be in the off-die memory 275 or in the cache 210) and assemble a response packet to the source address containing an acknowledgement that the data was stored to a memory.

Thus, the memory controller chiplet 205 can receive read and write requests via the chiplet network 280 and process the requests using the cache controller 215 interfacing with the cache 210. If the request cannot be handled by the cache controller 215, the off-die memory controller 220 handles the request by communication with the off-die memory 275, by the atomic and merge operations 250, or by both. Data read by the off-die memory controller 220 can be stored in the cache 210 by the cache controller 215 for later use.

The atomic and merge operations 250 are coupled to receive (as input) the output of the off-die memory controller 220, and to provide output to the cache 210, the network communication interface 225, or directly to the chiplet network 280. The memory hazard clear (reset) unit 260, write merge unit 255 and the built-in (e.g., predetermined) atomic operations unit 265 can each be implemented as state machines with other combinational logic circuitry (such as adders, shifters, comparators, AND gates, OR gates, XOR gates, or any suitable combination thereof) or other logic circuitry. These components can also include one or more registers or buffers to store operand or other data. The PAU 270 can be implemented as one or more processor cores or control circuitry, and various state machines with other combinational logic circuitry or other logic circuitry, and can also include one or more registers, buffers, or memories to store addresses, executable instructions, operand and other data, or can be implemented as a processor.

The write merge unit 255 receives read data and request data, and merges the request data and read data to create a single unit having the read data and the source address to be used in the response or return data packet). The write merge unit 255 provides the merged data to the write port of the cache 210 (or, equivalently, to the cache controller 215 to write to the cache 210). Optionally, the write merge unit 255 provides the merged data to the network communication interface 225 to encode and prepare a response or return data packet for transmission on the chiplet network 280.

When the request data is for a built-in atomic operation, the built-in atomic operations unit 265 receives the request and read data, either from the write merge unit 255 or directly from the off-die memory controller 220. The atomic operation is performed, and using the write merge unit 255, the resulting data is written to the cache 210, or provided to the network communication interface 225 to encode and prepare a response or return data packet for transmission on the chiplet network 280.

The built-in atomic operations unit 265 handles predefined atomic operations such as fetch-and-increment or compare-and-swap. In an example, these operations perform a simple read-modify-write operation to a single memory location of 32-bytes or less in size. Atomic memory operations are initiated from a request packet transmitted over the chiplet network 280. The request packet has a physical address, atomic operator type, operand size, and optionally up to 32-bytes of data. The atomic operation performs the read-modify-write to a cache memory line of the cache 210, filling the cache memory if necessary. The atomic operator response can be a simple completion response, or a response with up to 32-bytes of data. Example atomic memory operators include fetch-and-AND, fetch-and-OR, fetch-and-XOR, fetch-and-add, fetch-and-subtract, fetch-and-increment, fetch-and-decrement, fetch-and-minimum, fetch-and-maximum, fetch-and-swap, and compare-and-swap. In various example embodiments, 32-bit and 64-bit operations are supported, along with operations on 16 or 32 bytes of data. Methods disclosed herein are also compatible with hardware supporting larger or smaller operations and more or less data.

Built-in atomic operations can also involve requests for a "standard" atomic operation on the requested data, such as a comparatively simple, single cycle, integer atomics (e.g., fetch-and-increment or compare-and-swap), which will occur with the same throughput as a regular memory read or write operation not involving an atomic operation. For these operations, the cache controller 215 generally reserves a cache line in the cache 210 by setting a hazard bit (in hardware), so that the cache line cannot be read by another process while it is in transition. The data is obtained from either the off-die memory 275 or the cache 210, and is provided to the built-in atomic operation unit 265 to perform the requested atomic operation. Following the atomic operation, in addition to providing the resulting data to the data packet encoder 240 to encode outgoing data packets for transmission on the chiplet network 280, the built-in atomic operation unit 265 provides the resulting data to the write merge unit 255, which will also write the resulting data to the cache circuit 210. Following the writing of the resulting data to the cache 210, any corresponding hazard bit which was set will be cleared by the memory hazard clear unit 260.

The PAU 270 enables high performance (high throughput and low latency) for programmable atomic operations (also referred to as "custom atomic operations"), comparable to the performance of built-in atomic operations. Rather than executing multiple memory accesses, in response to an atomic operation request designating a programmable atomic operation and a memory address, circuitry in the memory controller chiplet 205 transfers the atomic operation request to PAU 270 and sets a hazard bit stored in a memory hazard register corresponding to the memory address of the memory line used in the atomic operation, to ensure that no other operation (read, write, or atomic) is performed on that memory line. The hazard bit is then cleared upon completion of the atomic operation. Additional direct data paths provided for the PAU 270 to execute the programmable atomic operations allow for additional write operations without any limitations imposed by the bandwidth of the communication networks and without increasing any congestion of the communication networks.

The PAU 270 include a RISC-V instruction set architecture (RISC-V ISA) based multi-threaded processor having one or more processor cores, and may further have an extended instruction set for executing programmable atomic operations. When provided with the extended instruction set for executing programmable atomic operations, the PAU 270 can be embodied as one or more hybrid threading processors. In some example embodiments, the PAU 270 provides barrel-style, round-robin instantaneous thread switching to maintain a high instruction-per-clock rate.

Programmable atomic operations can be performed by the PAU 270 that involve requests for a programmable atomic operation on the requested data. A user can prepare programming code to provide such programmable atomic operations. For example, the programmable atomic operations can be comparatively simple, multi-cycle operations such as floating-point addition, or comparatively complex, multi-instruction operations such as a Bloom filter insert. The programmable atomic operations can be the same as or different than the predetermined atomic operations, insofar as they are defined by the user rather than a system vendor. For these operations, the cache controller 215 can reserve a cache line in the cache 210, by setting a hazard bit (in hardware), so that cache line cannot be read by another process while it is in transition. The data is obtained from either the off-die memory 275 or the cache 210, and is provided to the PAU 270 to perform the requested programmable atomic operation. Following the atomic operation, the PAU 270 will provide the resulting data to the network communication interface 225 to directly encode outgoing data packets having the resulting data for transmission on the chiplet network 280. In addition, the PAU 270 will provide the resulting data to the cache controller 215, which will also write the resulting data to the cache 210. Following the writing of the resulting data to the cache 210, any corresponding hazard bit which was set will be cleared by the cache control circuit 215.

The approach taken for programmable atomic operations is to provide multiple, generic, custom atomic request types that can be sent through the chiplet network 280 to the memory controller chiplet 205 from an originating source such as a processor or other system component. The cache controller 215 and off-die memory controller 220 identify the request as a custom atomic request and forward the request to the PAU 270. In a representative embodiment, the PAU 270: (1) is a programmable processing element capable of efficiently performing a user defined atomic operation; (2) can perform load and stores to memory, arithmetic and logical operations and control flow decisions; and (3) can leverage the RISC-V ISA with a set of new, specialized instructions to facilitate interacting with the cache and off-die memory controllers 215, 220 to atomically perform the user-defined operation. It should be noted that the RISC-V ISA contains a full set of instructions that support high level language operators and data types. The PAU 270 can leverage the RISC-V ISA, but generally supports a more limited set of instructions and limited register file size to reduce the die size of the unit when included within the memory controller chiplet 205.

As mentioned above, any hazard bit which is set will be cleared by the memory hazard clear unit 260. Prior to the writing of the read data to the cache 210, a set hazard bit for the reserved cache line is to be cleared by the memory hazard clear unit 260. Accordingly, when the request and read data is received by the write merge unit 255, a reset or clear signal can be transmitted by the memory hazard clear unit 260 to the cache 210 to reset the set memory hazard bit for the reserved cache line. Also, resetting this hazard bit will also release a pending read or write request involving the designated (or reserved) cache line, providing the pending read or write request to an inbound request multiplexer for selection and processing.

A chiplet system such as the chiplet system 110 of FIG. 1A may include many chiplets and the chiplets may be arranged in a tightly packed matrix to create a higher performance functional block in a minimum footprint. To facilitate communication among the chiplets, the chiplets include multiple input-output (I/O) channels. An I/O channel can be implemented in any of multiple protocols and structures (for example, an AIB channel) to provide a communication channel between chiplets. In an example, the I/O channel could be used by a computing element of one chiplet (for example, a memory controller chiplet) to access memory of a second chiplet (which may store, for example, data in one or more memory die implementing one or more memory storage technologies). Memory requests would flow from the computing element of the first chiplet to the second chiplet and responses to the memory requests would flow in the reverse direction from the second chiplet back to the first chiplet. The I/O channels are arranged in columns of channels at the periphery of the chiplets, and extend to contacts (such as pads) configured to couple to conductive interconnects on an interposer to form a die-to-die physical layer interface. A set of hardware registers is included in the chiplets to support configuring by software of one or both of the channels and the columns of channels of the chiplets for interoperability.

The chiplets may be configured using an initialization process. The initialization process can be performed using hardware or software. In some examples, the initialization is performed after system reset using a dedicated interface such as an SPI. An SPI bus includes four signals: a serial clock (SCLK), a principal output subordinate input (POSI), a principal input subordinate output (PISO), and a subordinate select (SS). During each clock cycle of SCLK data may transmitted to shift data into registers of the chiplets using the POSI and PISO lines.

In some examples, one of the chiplets may serve as an SPI principal chiplet or SPI governing chiplet. The SPI principal chiplet may be a chiplet that includes a PCIe interface. The SPI principal chiplet connects to the other chiplets through the SPI bus to write the hardware registers to configure the columns of I/O channels. Once the SPI SCLK is up and running and the associated reset or resets are de-asserted, the SPI principal chiplet has access to the registers of the other chiplets.

In some examples, the configuration data that is written into the hardware registers of the chiplets may come from a host processor of a device separate from the chiplet system. The software running on the host processor may read and write memory-mapped input-output (MMIO) space that maps to the PCIe of the chiplet system. The host processor may provide the configuration data using a PCIe transaction that maps to the MMIO address space to the interface of the SPI principal chiplet. In some examples, the interface to the SPI principal chiplet is an external interface and the configuration data can be written directly to the SPI principal chiplet.

Figure 3:
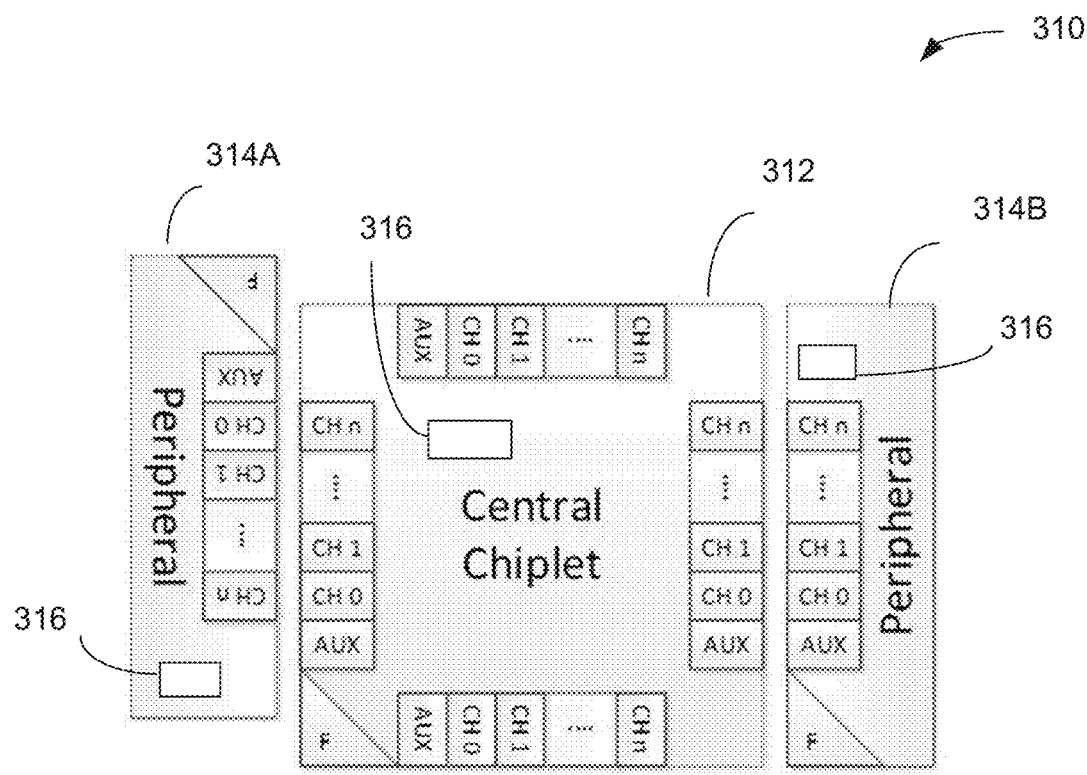
FIG. 3 is a block diagram illustrating an example of a chiplet based system on chip (SoC) device, in accordance with some examples described herein.

FIG. 3 is a block diagram illustrating an example of portions of a chiplet-based system 310 including a central chiplet 312 bordered by two periphery chiplets 314A, 314B. Each of the chiplets may use multiple channels of I/O. Several channels may be "bonded" together or combined to form a wider interface or wider channel. Additionally, several channels can be "ganged" or grouped together into multiple columns of I/O channels. The central chiplet 312 shows a column on each side of the chiplet with channels labeled (AUX, CH0, CH1 . . . CHn). Each of the periphery chiplets 314A, 314B shows a column with the same designated channels as the columns of the central chiplet. The references in the description to the "central" chiplet and "peripheral" chiplets are meant to provide clarity in the description of where I/O channels of the interface are re-programmed; and contain no other implication as to configuration, function, or physical placement of such chiplets in a chiplet-based system. In a chiplet-based system, any—or all—chiplets may be configured with registers and/or other circuitry providing programmable configuration of I/O Channels on the chiplet. For example, in accordance with the discussion below, the central chiplet may be implemented to provide programmability of I/O channels on one or more sides; while a peripheral chiplet in communication with the central chiplet may be implemented to provide programmability at an interface on an additional side of the central chiplet.

FIG. 3 shows that the periphery chiplets may need to be rotated with respect to the central chiplet or chiplets to allow use of all four sides of the central chiplet. One or both of the columns and the channels of a peripheral chiplet may need to be reversed from the original orientation to align to the channels of the central chiplet 312. In FIG. 3, it can be seen that the periphery chiplet 314A on the left-hand side of the diagram should be reversed from the original orientation so that the channels match the channels of the central chiplet 312. When an interconnect becomes reversed, it would be desirable for there to be a means for software to correctly re-orient the interface in hardware. FIG. 3 is a simplified block diagram and an actual chiplet system may include many chiplets. As noted above, a memory controller chiplet is one example of a chiplet that may have I/O channel interfaces on multiple (or all) sides (as depicted for chiplets 312, 412A, and 412B). In the example of a memory controller chiplet, some example configurations will have an industry-standard memory interface on one or more sides; and a programmable channel I/O interface, as described above, on one or more sides.

Figure 4:
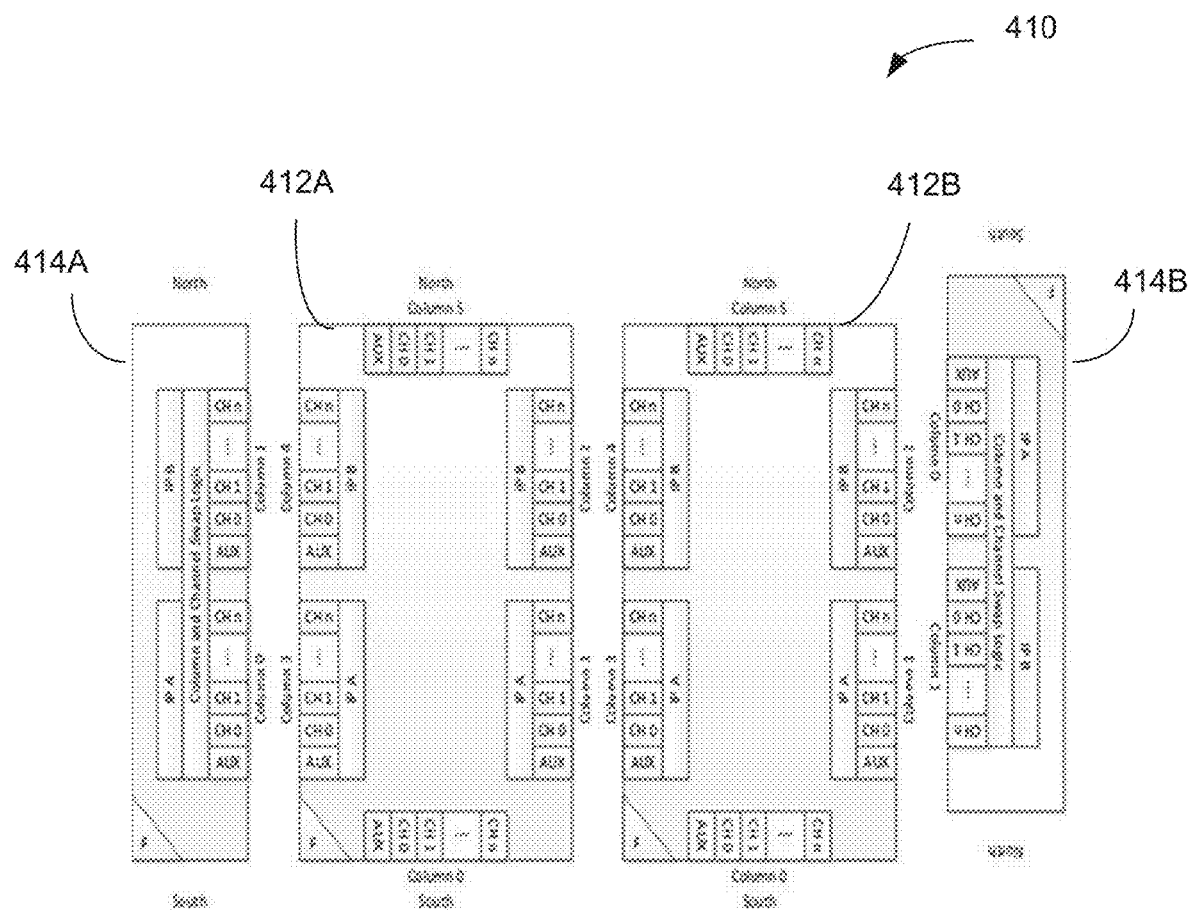
FIG. 4 is a is a block diagram illustrating another example of a chiplet based SoC device, in accordance with some examples described herein.

FIG. 4 is a block diagram illustrating another example embodiment of a chiplet system 410. The example shows two central chiplets 412A, 412B and two periphery chiplets 414A and 414B. Each of the central and periphery chiplets have two columns of channels on one side of the chiplet. In the diagram, it can be seen that the two channels of the columns of chiplet 414B on the right need to be reversed for interconnection to the columns on the right-hand edge of central chiplet 412B.

A single channel (e.g., CHn) of I/O of a column forms the smallest interface component or unit and a single channel includes multiple receive (RX) and transmit (TX) lines carrying RX and TX signals. A single column includes multiple channels of I/O. Within a column, multiple channels can be bonded together to form a wider channel interface. For example, CH0 and CH1 of a column can be bonded together to form a channel twice as wide as one of the channels.

To facilitate reversing the columns and bonding multiple unit-sized channels together into wider channels, the chiplets include a set of hardware-based, software-accessible registers. The capabilities of the channel hardware can be communicated to software using the registers and the channels and columns can be configured by the software using the registers. The registers can be included in the chiplet Column and Channel Swap Logic circuitry 316 shown in FIG. 3. In the column and channel swap logic circuitry of a chiplet, there is a set of capability and configuration registers associated with the columns of I/O channels, and a set of capability and configuration registers associated with the channels of the columns. FIG. 5-8 illustrate some examples of capability and configuration registers.

Figure 5:
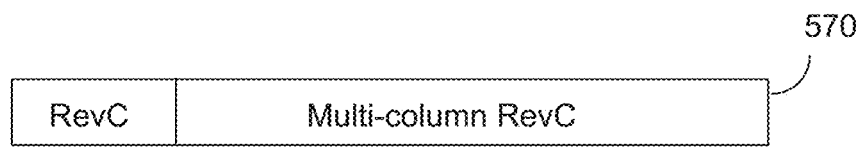
FIG. 5 is a diagram of an example of a column capability register of a chiplet, in accordance with some examples described herein.

FIG. 5 is a diagram of an example of a column capability register 570. Each column of a chiplet may include a column capability register 570. The column capability register includes a column reversal capable (RevC) field. The RevC field can written with a value indicating that the order of the channels of the column is reversable (e.g., because the column is connected to swap logic circuitry that supports channel reversal). The RevC field is then readable by software when configuring the columns of the chiplet, and the RevC field indicates that column reversal is available.

Figure 6:
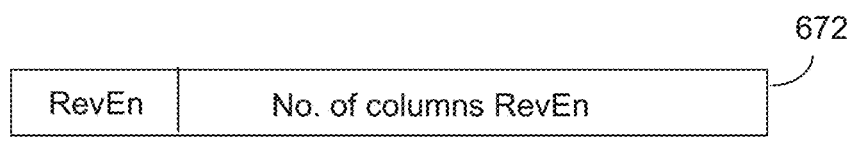
FIG. 6 is a diagram of an example of a column configuration register of a chiplet, in accordance with some examples described herein.

FIG. 6 is a diagram of an example of a column configuration register 672. Each column of a chiplet may include a column configuration register 672. The column configuration register 672 includes a column reversal enable field (RevEn). Enabling the column reversal enable field enables the reversal of the channels of the column. In the example of FIG. 3, enabling the column reversal enable field of the column of periphery chiplet 314A reverses the order of the channels in the column to match the channels of the left-hand column of the central chiplet 312.

Returning to FIG. 5, the column capability register 570 may also include a multi-column reverse capable (Multi-Column RevC) field. The multi-column reverse capable field indicates if the column is connected to swap logic circuitry to support multi-column reversal of a number of columns. In some examples, the multi-column reverse capable field is a bit vector. If a bit of a bit vector is set, this indicates that the column supports multi-column reversal across a number of columns equal with the number of columns equal to the bit position set plus one. For example, if the bit of bit position two of the multi-column reverse capable field is set, this indicates that the column supports reversal across three columns.

Returning to FIG. 6, the column configuration register 672 includes a number of columns to reverse enable (No. Col. RevEn) field to enable reversal of multiple columns of a chiplet. In the example of FIG. 4, the number of columns to reverse enable can be used to reverse the order of the channels of the column in right-hand periphery chiplet 414B to match the channels of the columns of the right-hand edge of central chiplet 412B. Note that the columns of the right-hand edge of central chiplet 412B includes interface A (IPA) and interface B (IPB). Both columns of the right-hand periphery chiplet 414B need to be reversed together for the interfaces to align correctly. Reversing the order of the columns individually rather than both together would not result in the correct interface alignment.

Returning to FIG. 6, in some examples writing a value N to the number of columns to reverse enable reverses N columns of the chiplet starting with the column corresponding to the column configuration register and the N−1 columns above the column, where N is a positive integer. For example, writing the value 2 into the number of columns to reverse enable field of column 1 of periphery chiplet 414B reverses both the column 2 and column 1 together. This can be useful when the channels of more than one column are grouped together.

The approach to channel reversal can be extended to reversal of less than a full column of channels. The reverse capability registers and reversal enable registers can be extended to include fields in the registers to selectively reverse a subset of the channels within a column instead of the whole column. This may be useful to reverse one or more portions of one column that extends over multiple chiplets.

As explained previously herein, the logic circuitry of a chiplet includes capability and configuration registers associated with the channels of the columns. These capability and configuration registers are used to bond multiple unit-sized channels together into wider channels.

Figure 7:
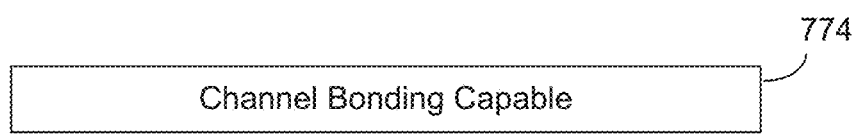
FIG. 7 is a diagram of an example of a channel capability register of a chiplet, in accordance with some examples described herein.

FIG. 7 is a diagram of an example of a programmable channel capability register 774. In certain examples, each channel of a chiplet includes a channel capability register 774. The channel capability register 774 includes a channel bonding capable field. The channel bonding capable field may be a bit vector. Setting a bit of the bit vector indicates that the channel supports bonding across a number of channels equal to the bit position of the bit vector plus one.

Figure 8:
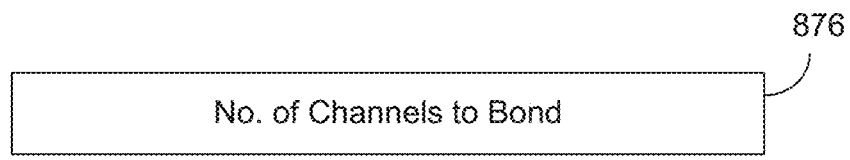
FIG. 8 is a diagram of an example of a channel configuration register of a chiplet, in accordance with some examples described herein.

FIG. 8 is a diagram of an example of a programmable channel configuration register 876. In certain examples, each channel of a chiplet includes a channel configuration register 876. The channel configuration register 876 includes a number of channels to bond field that indicates the number of channels to bond together into a channel interface. In certain examples, writing a value X into the number of channels to bond field bonds the channel corresponding to the channel configuration register 876 and the X−1 channels designated above it into one channel interface of X unit-sized channels, where X is a positive integer greater than one. In certain examples, the number of channels bonded may extend beyond the channels of one column. In this way, channels of channels of multiple columns can be bonded into the wider channel interface.

Figure 9:
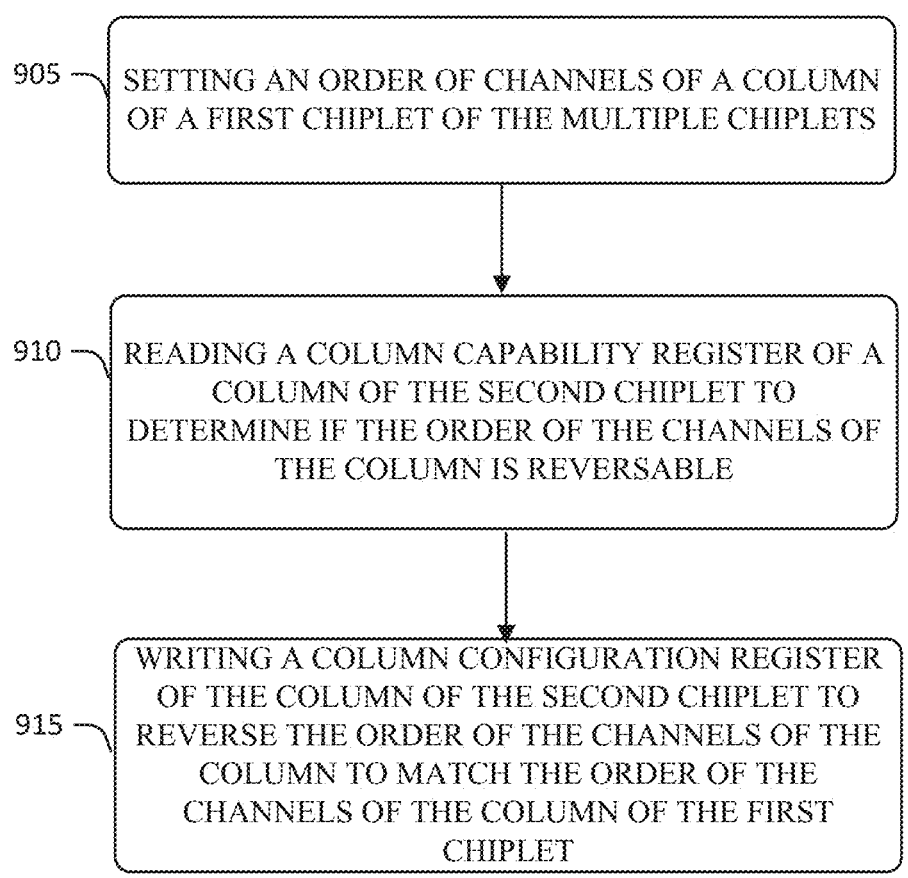
FIG. 9 is a flow diagram of a method to configure input-output channels of chiplets of a computing device, in accordance with some examples described herein.

FIG. 9 is a flow diagram of an example of a method 900 performed by a circuit or system to configure I/O channels of chiplets of a chiplet-based system. The I/O channels of a chiplet are arranged as columns of the chiplet. At 905, the order of channels of a column of a first chiplet of the system is set. The order of the channels may be set as a default configuration. A second chiplet of the system is programmed according to the arrangement of the channels of the first chiplet. At 910, a column capability register of a column of the second chiplet is read to determine if the order of the channels of the column is reversable to change the order of channels of a column of the second chiplet to match the order of channels of the column of the first chiplet. At 915, a column configuration register of the column of the second chiplet is written to reverse the order of the channels of the column to match the order of the channels of the column of the first chiplet.

In some examples, the order of channels of the column of the second chiplet is reversed to match the order of channels of the column of the first chiplet. In some examples, multiple channels of the first chiplet are programmed to bond the multiple channels together as a wider channel interface. Multiple channels of the second chiplet are bonded together to match the wider channel interface of the first chiplet.

Figure 10:
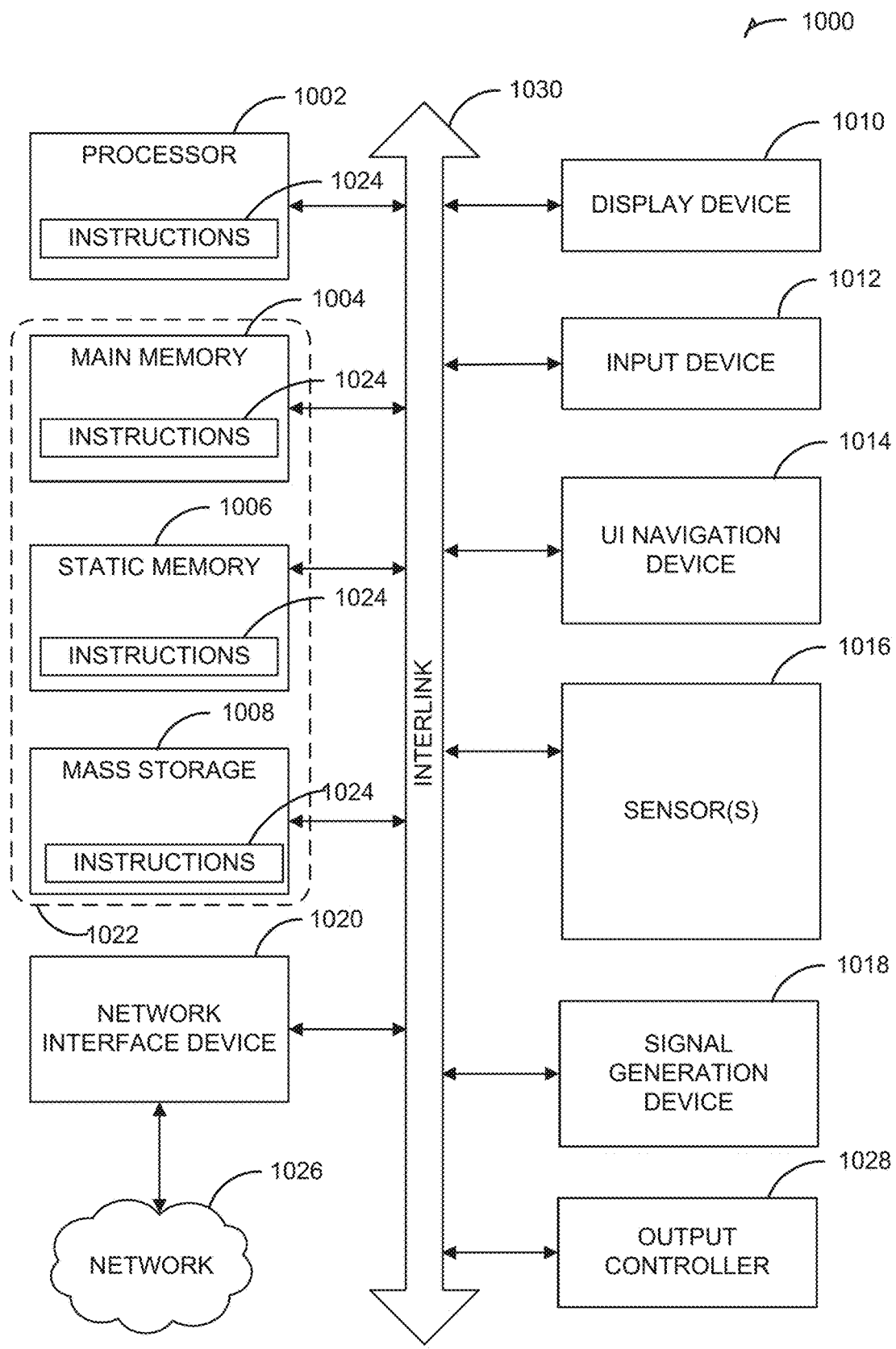
FIG. 10 is a block diagram of an example machine, in accordance with some examples described herein.

FIG. 10 illustrates a block diagram of an example machine 1000 upon which any one or more of the techniques (e.g., methodologies) discussed herein may be implemented. Examples, as described herein, may include, or may operate by, logic or a number of components, or mechanisms in the machine 1000. Circuitry (e.g., processing circuitry) is a collection of circuits implemented in tangible entities of the machine 1000 that include hardware (e.g., simple circuits, gates, logic, etc.). Circuitry membership may be flexible over time. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a machine readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine-readable medium elements are part of the circuitry or are communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time. Additional examples of these components with respect to the machine 1000 follow.

In alternative embodiments, the machine 1000 may operate as a standalone device or may be connected (e.g., networked) to other machines. In a networked deployment, the machine 1000 may operate in the capacity of a server machine, a client machine, or both in server-client network environments. In an example, the machine 1000 may act as a peer machine in peer-to-peer (P2P) (or other distributed) network environment. The machine 1000 may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine (e.g., computer system) 1000 may include a hardware processor 1002 (e.g., a central processing unit (CPU), a graphics processing unit (GPU), a hardware processor core, or any combination thereof), a main memory 1004, a static memory (e.g., memory or storage for firmware, microcode, a basic-input-output (BIOS), unified extensible firmware interface (UEFI), etc.) 1006, and mass storage 1008 (e.g., hard drives, tape drives, flash storage, or other block devices) some or all of which may communicate with each other via an interlink (e.g., bus) 1030. The machine 1000 may further include a display unit 1010, an alphanumeric input device 1012 (e.g., a keyboard), and a user interface (UI) navigation device 1014 (e.g., a mouse). In an example, the display unit 1010, input device 1012 and UI navigation device 1014 may be a touch screen display. The machine 1000 may additionally include a storage device (e.g., drive unit) 1008, a signal generation device 1018 (e.g., a speaker), a network interface device 1020, and one or more sensors 1016, such as a global positioning system (GPS) sensor, compass, accelerometer, or other sensor. The machine 1000 may include an output controller 1028, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the processor 1002, the main memory 1004, the static memory 1006, or the mass storage 1008 may be, or include, a machine readable medium 1022 on which is stored one or more sets of data structures or instructions 1024 (e.g., software) embodying or utilized by any one or more of the techniques or functions described herein. The instructions 1024 may also reside, completely or at least partially, within any of registers of the processor 1002, the main memory 1004, the static memory 1006, or the mass storage 1008 during execution thereof by the machine 1000. In an example, one or any combination of the hardware processor 1002, the main memory 1004, the static memory 1006, or the mass storage 1008 may constitute the machine-readable media 1022. While the machine-readable medium 1022 is illustrated as a single medium, the term "machine readable medium" may include a single medium or multiple media (e.g., a centralized or distributed database, and/or associated caches and servers) configured to store the one or more instructions 1024.

The term "machine-readable medium" may include any medium that is capable of storing, encoding, or carrying instructions for execution by the machine 1000 and that cause the machine 1000 to perform any one or more of the techniques of the present disclosure, or that is capable of storing, encoding or carrying data structures used by or associated with such instructions. Non-limiting machine-readable medium examples may include solid-state memories, optical media, magnetic media, and signals (e.g., radio frequency signals, other photon-based signals, sound signals, etc.). In an example, a non-transitory machine-readable medium comprises a machine-readable medium with a plurality of particles having invariant (e.g., rest) mass, and thus are compositions of matter. Accordingly, non-transitory machine-readable media are machine readable media that do not include transitory propagating signals. Specific examples of non-transitory machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

In an example, information stored or otherwise provided on the machine readable medium 1022 may be representative of the instructions 1024, such as instructions 1024 themselves or a format from which the instructions 1024 may be derived. This format from which the instructions 1024 may be derived may include source code, encoded instructions (e.g., in compressed or encrypted form), packaged instructions (e.g., split into multiple packages), or the like. The information representative of the instructions 1024 in the machine readable medium 1022 may be processed by processing circuitry into the instructions to implement any of the operations discussed herein. For example, deriving the instructions 1024 from the information (e.g., processing by the processing circuitry) may include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions 1024.

In an example, the derivation of the instructions 1024 may include assembly, compilation, or interpretation of the information (e.g., by the processing circuitry) to create the instructions 1024 from some intermediate or preprocessed format provided by the machine readable medium 1022. The information, when provided in multiple parts, may be combined, unpacked, and modified to create the instructions 1024. For example, the information may be in multiple compressed source code packages (or object code, or binary executable code, etc.) on one or several remote servers. The source code packages may be encrypted when in transit over a network and decrypted, uncompressed, assembled (e.g., linked) if necessary, and compiled or interpreted (e.g., into a library, stand-alone executable etc.) at a local machine, and executed by the local machine.

The instructions 1024 may be further transmitted or received over a communications network 1026 using a transmission medium via the network interface device 1020 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1020 may include one or more physical jacks (e.g., Ethernet, coaxial, or phone jacks) or one or more antennas to connect to the communications network 1026. In an example, the network interface device 1020 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 1000, and includes digital or analog communications signals or other intangible medium to facilitate communication of such software. A transmission medium is a machine readable medium.

In the foregoing specification, some example implementations of the disclosure have been described. It will be evident that various modifications can be made thereto without departing from the broader scope and spirit of the disclosure as set forth in the following claims. The specification and drawings are, accordingly, to be regarded in an illustrative sense rather than in a restrictive sense. Below is a non-exhaustive list of examples of implementations of the present disclosure.

Example 1 includes subject matter (such as a system) comprising an interposer and multiple chiplets arranged on the interposer. The interposer includes multiple conductive interconnects and the multiple chiplets are interconnected via the interposer. Each chiplet includes a die-to-die interface including one or more pads to engage the interconnect of the interposer. At least one chiplet includes multiple input-output channels organized into at least one column and arranged in an order at a periphery of the chiplet forming a die-to-die interface to engage the interconnects of the interposer, and the order of the channels of the column is programmable.

In Example 2, the subject matter of Example 1 optionally includes a chiplet that includes multiple columns, and the channels of the columns of the chiplet are bondable together to form a channel interface including multiple combined channels.

In Example 3, the subject matter of Example 2 optionally includes a chiplet that includes a programmable channel capability register for each channel, the channel capability register including a channel bonding capable field that is a bit vector indicating that the channel supports bonding across a number of channels indicated by the bit vector.

In Example 4, the subject matter of one or both of Examples 2 and 3 optionally includes a chiplet that includes a programmable channel configuration register for each channel, the channel configuration register including a writeable bond field to indicate a number of channels to bond together into a wider combined channel interface.

In Example 5, the subject matter of Example 4 optionally includes a channel configuration register that includes a writeable bond field that indicates a number of channels of multiple columns to bond together into a combined channel interface that spans the multiple columns.

In Example 6, the subject matter of Example 5 optionally includes a chiplet in which the channels of the chiplet are numbered, and writing a value of X into the channel configuration register combines the Xth channel and the channels numbered less than X into the combined channel, wherein X is a positive integer greater than one.

In Example 7, the subject matter of one or any combination of Examples 1-6 optionally includes a chiplet that includes a programmable column capability register for each column, the column capability register including: a column reversal capable field writeable to indicate that the order of the channels of the column is reversable; and wherein the channels of the chiplet can be grouped together into a channel that spans multiple columns.

In Example 8, the subject matter of Example 7 optionally includes a chiplet having a column capability register that includes a multi-column reversal capable field that is a bit vector indicating that the column supports multi-column reversal across a number of columns indicated by the bit vector.

In Example 9, the subject matter of claim of one or both of Examples 7 and 8 optionally include a chiplet that includes a column configuration register for each column, the column configuration register including a column reversal enable field configured to enable reversal of the order of the channels of the column.

In Example 10, the subject matter of Example 9 optionally includes a column configuration register that includes a number of columns to reverse field configured to enable reversal of a number of columns indicated by the number of columns to reverse field.

In Example 11, the subject matter of Example 10 optionally includes a chiplet in which columns of the chiplet are numbered and writing a value N to the number of columns to reverse field reverses the order of the column of the chiplet and the N−1 lowered numbered columns of the chiplet, where N is a positive integer greater than one.

Example 12 includes subject matter (such as a method) or can optionally be combined with one or any combination of Examples 1-11 to include such subject matter, comprising setting an order of channels of a column of a first chiplet of the multiple chiplets of a chiplet-based system, wherein one or more of the multiple chiplets include field-configurable input-output channels arranged at a periphery of the chiplets; and programming a second chiplet of the multiple chiplets to change an order of channels of a column of the second chiplet to match the order of channels of the column of the first chiplet.

In Example 13, the subject matter of Example 12 optionally includes reading a column capability register of a column of the second chiplet to determine if the order of the channels of the column is reversable, and writing a column configuration register of the column of the second chiplet to reverse the order of the channels of the column.

In Example 14, the subject matter of one or both of Examples 12 and 13 optionally includes reading a column capability register of a column to determine if the column supports multi-column reversal, and writing a column configuration register to reverse an order of channels of multiple columns of the second chiplet to match an order of channels of multiple columns of the first chiplet.

In Example 15, the subject matter of one or any combination of Examples 12-14 optionally includes reading a channel capability register of a channel of the column of the second chiplet to determine if the channel supports bonding to another channel, and writing a channel configuration register of the channel to bond the channel with one or more other channels of the second chiplet into a combined channel interface.

In Example 16, the subject matter of Example 15 optionally includes writing channel configuration registers of multiple channels of the second chiplet to bond the multiple channels into a combined channel that is included in multiple columns, and writing a column configuration register to reverse the order of the channels of the multiple columns.

In Example 17, the subject matter of one or both of Examples 15 and 16 optionally includes writing a value of X into the channel configuration register that combines the channel and X−1 other channels into the combined channel, wherein X is a positive integer greater than one.

Example 18 can include subject matter (or can optionally be combined with one or any combination of Examples 1-17 to include such subject matter) such as machine-readable medium including instructions that, when executed by a system, cause the system to perform operations comprising setting an order of channels of a column of a first chiplet of multiple chiplets of the system, wherein one or more chiplets of the multiple chiplets include input-output channels arranged as one or more columns at a periphery of the chiplets, and writing a value to a column configuration register of a second chiplet of the multiple chiplets to reverse an order of channels of a column of the second chiplet to match the order of channels of the column of the first chiplet.

In Example 19, the subject matter of Example 18 optionally includes a machine-readable medium including instructions that cause the system to perform operations including writing a value to a channel configuration register of the first chiplet to bond channels of the column of the first chiplet into a combined channel of the first chiplet, and writing a value to a channel configuration register of the second chiplet to bond one or more reversed order channels of the column of the second chiplet into a combined channel of the second chiplet to form an interface with the combined channel of the first chiplet.

In Example 20, the subject matter of one or both of Examples 18 and 19 optionally includes reading a column capability register of the second chiplet to determine if the column supports multi-column reversal, and writing a value to the column configuration register to reverse an order of channels of multiple columns of the second chiplet to match an order of channels of multiple columns of the first chiplet.

Example 21 can include subject matter (such as a memory controller chiplet) or can optionally be combined with one or any combination of Examples 1-20 to includes such subject matter, comprising a supporting substrate including a chiplet physical interface including multiple contacts spaced and configured to engage respective conductive interconnects on an interposer including multiple conductive interconnects; and processing circuitry including one or more processors supported on the substrate, the memory controller chiplet configured to perform memory operations on a memory array. The chiplet interface includes multiple input-output channels organized into at least one column, and in a selected order, wherein the order of the channels of the column is programmable.

In Example 22, the subject matter of Example 21 optionally includes a chiplet that includes multiple columns, and the channels of the columns of the chiplet are bondable together to form a channel interface including multiple combined channels.

In Example 23, the subject matter of one or both of Examples 21 and 22 optionally includes processing circuitry that comprises a programmable channel capability register for each channel.

These non-limiting Examples can be combined in any permutation or combination.

What is claimed is:

1. A system comprising:
   an interposer including multiple conductive interconnects; and
   multiple chiplets arranged on the interposer and interconnected via the interposer, each chiplet including a die-to-die interface including one or more pads to engage the interconnect of the interposer; and wherein at least one chiplet includes:

multiple input-output channels organized into at least one column and arranged in an order at a periphery of the at least one chiplet forming the die-to-die interface to engage the interconnects of the interposer, wherein the order of the input-output channels of the column is programmable;

multiple columns, and wherein the channels of the columns of the chiplet are bondable together to form a channel interface including multiple combined channels; and a programmable channel configuration register for each channel, the channel configuration register including a writeable bond field to indicate a number of channels to bond together into a wider combined channel interface.

2. The system of claim 1, wherein the at least one chiplet includes a programmable channel capability register for each channel, the channel capability register including a channel bonding capable field that is a bit vector indicating that the channel supports bonding across a number of channels indicated by the bit vector.

3. The system of claim 1, wherein the writeable bond field indicates a number of channels of multiple columns to bond together into a combined channel interface that spans the multiple columns.

4. The system of claim 3, wherein the channels of the at least one chiplet are numbered, and writing a value of X into the channel configuration register combines the Xth channel and the channels numbered less than X into the combined channel interface, wherein X is a positive integer greater than one.

5. A system comprising:

an interposer including multiple conductive interconnects;

multiple chiplets arranged on the interposer and interconnected via the interposer, each chiplet including a die-to-die interface including one or more pads to engage the interconnect of the interposer; and wherein at least one chiplet includes:

multiple input-output channels organized into at least one column and arranged in an order at a periphery of the at least one chiplet forming the die-to-die interface to engage the interconnects of the interposer, wherein the order of the input-output channels of the column is programmable; and a programmable column capability register for each column, the column capability register including:

a column reversal capable field writeable to indicate that the order of the channels of the column is reversable; and wherein the channels of the chiplet can be grouped together into a channel that spans multiple columns.

6. The system of claim 5, wherein the column capability register includes a multi-column reversal capable field that is a bit vector indicating that the column supports multi-column reversal across a number of columns indicated by the bit vector.

7. The system of claim 5, wherein the at least one chiplet includes a column configuration register for each column, the column configuration register including a column reversal enable field configured to enable reversal of the order of the channels of the column.

8. The system of claim 7, wherein the column configuration register includes a number of columns to reverse field configured to enable reversal of a number of columns indicated by the number of columns to reverse field.

9. The system of claim 8, wherein the columns of the at least one chiplet are numbered and writing a value N to the number of columns to reverse field reverses the order of the column of the chiplet and the N−1 lowered numbered columns of the chiplet, where N is a positive integer greater than one.

10. A memory controller chiplet, comprising:

a supporting substrate including a chiplet physical interface including multiple contacts spaced and configured to engage respective conductive interconnects on an interposer including multiple conductive interconnects;

processing circuitry including one or more processors supported on the substrate, the memory controller chiplet configured to perform memory operations on a memory array; and wherein the chiplet physical interface includes multiple input-output channels organized into at least one column, and in a selected order, wherein the order of the channels of the column is programmable; and wherein the processing circuitry includes a programmable channel capability register for each channel, the programmable channel capability register including a channel bonding capable field that is a bit vector indicating that the channel supports bonding across a number of channels indicated by the bit vector.

11. The memory controller chiplet of claim 10, wherein the chiplet includes multiple columns, and wherein the channels of the columns of the chiplet are bondable together to form a channel interface including multiple combined channels.

* * * * *